United States Patent [19]

Murdoch

[11] Patent Number: 5,046,909
[45] Date of Patent: Sep. 10, 1991

[54] METHOD AND APPARATUS FOR HANDLING SEMICONDUCTOR WAFERS

[75] Inventor: Steven Murdoch, Palo Alto, Calif.

[73] Assignee: Applied Materials, Inc., Santa Clara, Calif.

[21] Appl. No.: 632,599

[22] Filed: Dec. 24, 1990

Related U.S. Application Data

[63] Continuation of Ser. No. 373,734, Jun. 29, 1989, abandoned.

[51] Int. Cl.$^5$ .......................... B65H 1/62; B65H 5/00
[52] U.S. Cl. .................................... 414/225; 294/113; 414/786
[58] Field of Search ............... 414/225, 222, 417, 786; 294/113, 86.4, 902; 269/221, 903

[56] References Cited

U.S. PATENT DOCUMENTS

| | | | |
|---|---|---|---|
| 4,306,731 | 12/1981 | Shaw | 279/4 |
| 4,473,455 | 9/1984 | Dean et al. | 204/298 |
| 4,529,353 | 7/1985 | Dean et al. | 414/225 X |
| 4,584,045 | 4/1986 | Richards | 414/222 X |
| 4,779,877 | 10/1988 | Shaw | 279/4 |

Primary Examiner—Robert J. Spar
Assistant Examiner—Donald W. Underwood
Attorney, Agent, or Firm—John P. Taylor

[57] ABSTRACT

A method and apparatus is disclosed for handling semiconductor wafers used for the production of integrated circuit structures which permits moving the wafer from one processing station to another without direct handling of the wafer and which also permits equal processing of both the top and bottom surfaces of the wafer. A wafer retaining ring is disclosed having structure for engaging the retaining ring to transfer the wafer and the retaining ring from one processing station to another to perform a plurality of processing steps on one or both surfaces of the wafer without direct handling of the wafer. The retaining ring is also provided with structure for engaging the end edges of the wafer leaving both the top and bottom surfaces of the wafer equally exposed for processing. The retaining ring has an inner diameter sufficiently large with respect to the outer diameter of the wafer so as to not interfere with processing by shadowing either side of the wafer.

26 Claims, 7 Drawing Sheets

METHOD AND APPARATUS FOR HANDLING SEMICONDUCTOR WAFERS

This application is a continuation of application Ser. No. 373,734, filed June 29, 1989, abandoned.

BACKGROUND OF THE INVENTION

1. Field of the Invention

This invention relates to a method and apparatus for handling semiconductor wafers used in the production of integrated circuit structures. More particularly, this invention relates to a method and apparatus for handling semiconductor wafers in a manner which will permit transporting of the wafer from one processing station to another without handling of the wafer, thus reducing formation of loose particulate, and which also permits processing of both the top and bottom surfaces of the wafer equally while mitigating the effects of shadowing.

2. Description of the Related Art

During the processing of semiconductor wafers such as silicon wafers to form integrated circuit structures in and on the wafer, it is necessary to perform a number of processing steps which require transport of the wafer to various apparatuses or chambers within an apparatus. Conventionally this involves the direct physical engagement of the wafer, either manually or by robotic means, to move the wafer between such apparatuses or process stations.

Each such step of physical handling of the wafer can result in the dislodgment of particulates from the wafer surfaces during such handling or other damage to the wafer which can lead to in failure of some of the chips or dies, thus lowering the yield of chips per wafer.

Integrated circuit structures are usually formed on or in one surface of a semiconductor wafer. As a result, wafer handling and transfer methodologies have been developed for processes which involve only one surface of a wafer, conventionally the upper surface.

However, there is a growing amount of interest in processing both surfaces of a semiconductor wafer during the construction of integrated circuit structures, and in particular, the necessity to remove oxide films from the backside of wafers without surface contact either front or back. To remove these oxide films that have been deposited, the wafer face (the front surface) is conventionally pushed upward to some grounding surface, thereby endangering the already processed surface, with a contacting and rubbing motion creating particulate.

Since the wafer is conventionally supported during processing by resting the bottom surface of the wafer on a support surface, processing of the bottom surface by conventional means can require turning the wafer over to expose the bottom surface. This not only involves extra process steps, but even further direct handling of the wafer as well, which can further add to the risk of damage to the wafer, e.g., from particulates which may become dislodged from the wafer surfaces during such handling.

Furthermore, while supporting the wafer from the sides during processing rather than the bottom would allow access to the bottom surface of the wafer for processing, it is well known that the placement of any device or material near the wafer during processing can cause severe "shadowing" of the process on the wafer, i.e. the placement of a device or material adjacent the wafer during processing results in incomplete etching, deposition, etc. in those areas of the wafer surface immediately adjacent such device or material.

Dean et al U.S. Pat. No. 4,473,455 describes a wafer holding assembly wherein a number of wafers are loaded onto a plate. Pedestal elements engage the backside surfaces of the wafers. The wafers are held in the plate by clips which are attached to springs mounted on the plate and which engage the ends edges and the edge of the front surfaces of the wafers.

Shaw U.S. Pat. Nos. 4,306,731 and 4,779,877 disclose a wafer support assembly comprising a wafer plate assembly having an aperture larger than the diameter of the wafer. Spring clips comprising spring bands or spring wires carried by the wafer plate assembly have arcuate ends which engage the wafer surfaces adjacent the edges of the wafer.

It would, however, be highly desirable to provide a process and apparatus which would permit transport of a wafer from one process station to another or from one apparatus to another without direct handling of the wafer as well as in a manner which would permit equal processing of both sides of a semiconductor wafer without increasing the risk of shadowing of the wafer on either side of the surface of the wafer during processing.

SUMMARY OF THE INVENTION

It is, therefore an object of the invention to provide a method and apparatus for handling semiconductor wafers which permits transporting of the wafer from one processing station to another without direct handling of the wafer to reduce dislodgment of particulate from the wafer during such handling as well as other damage to the wafer from such direct handling.

It is another object of the invention to provide a method and apparatus for handling semiconductor wafers which permits transporting of the wafer from one processing station to another without direct handling of the wafer using wafer retaining means which support the wafer during processing in a manner which mitigates the effects of shadowing by objects adjacent the wafer during processing.

It is yet another object of the invention to provide a method and apparatus for handling semiconductor wafers which permits transporting of the wafer from one processing station to another without direct handling of the wafer using wafer retaining means which support the wafer during processing in a manner which mitigates the effects of shadowing by objects adjacent the wafer during processing and which permits equal processing of both the top and bottom surfaces of the wafer.

These and other objects of the invention will be apparent from the following description and accompanying illustrations.

DETAILED DESCRIPTION OF THE INVENTION

Figure 1:
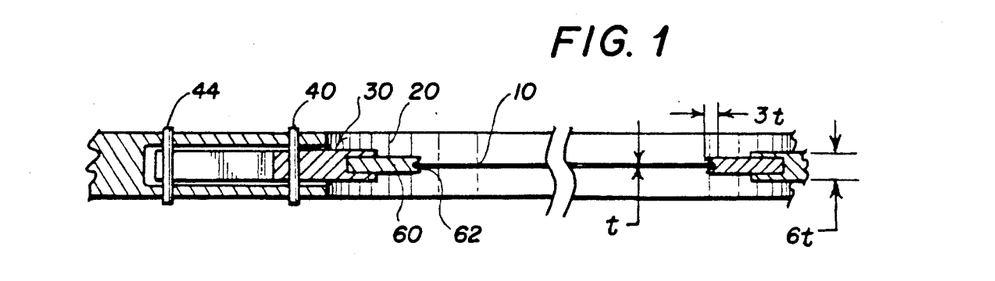
FIG. 1 is a vertical cross-sectional view of a retaining ring holding a semiconductor wafer.

Referring now to FIG. 1, a semiconductor wafer 10 is shown which has been inserted into a retaining ring 20, constructed of a metal such as aluminum, including anodized aluminum, or a ceramic material such as alumina, or any other material which will not interfere with processing of wafer 10. Wafer 10 may be held within retaining ring 20 by engagement with tips 60 on the ends of yieldable clip mechanisms 30 while the wafer is moved between processing stations as well as being retained therein during a number of process steps without any direct handling of the wafer after initial insertion and prior to removal of the wafer after such processing steps.

The height or thickness of tip 60 on clip mechanism 30 will be about 6t where t=the thickness of wafer 10, which usually ranges from about 0.0280-0.032", i.e., the height or thickness of ceramic tip 60 is dimensioned to not exceed about 6 times the thickness of wafer 10 to minimize interference with the processing of both sides of wafer 10. The depth of the grooved end surface 62 in which wafer rests when engaged by clip mechanism 30, as will be described in more detail below with respect to FIGS. 8-12, will be about 3t, i.e., about three times the thickness of wafer 10, again to minimize any interference with the processing of both sides of wafer 10.

As will be more clearly seen in subsequent figures, clip mechanisms 30, and tips 60 thereon, space the outer edge of wafer 10 from the inner diameter of retaining ring 20. Tip 60 extends from clip mechanism 30 a distance of at least about 0.5 inches or greater to prevent retaining ring 20 from interfering with the processing of wafer 10, i.e., which permits the wafer to remain mounted within the retaining ring during processing as well as during transport from one processing station to another, thus greatly reducing direct handling of the wafer in between processing steps.

Thus, even when the end of clip mechanism 30 is flush with the inner edge of retaining ring 20, retaining ring 20 is still separated from the outer edge of wafer 10 by a distance of at least 0.5"-3t, where 3t is the depth of groove 32 in tip 60.

Therefore, the presence of retaining ring 20 around wafer 10 during processing of the wafer will not result in "shadowing" of the processing adjacent the periphery of wafer 10 in view of the spacing there between. In this regard, it will be further noted that the engagement of wafer 10 by clip mechanisms 30 and tips 60 is symmetrical with respect to the top and bottom surfaces of wafer 10, thus permitting equal access and processing of both top and bottom surfaces.

Figure 2:
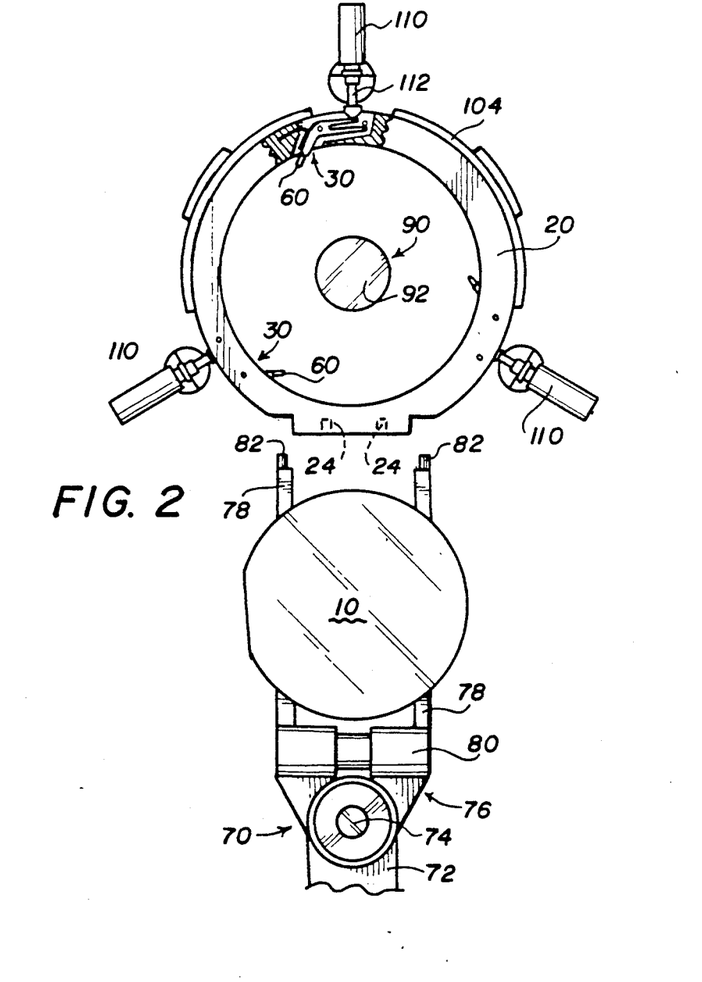
FIG. 2 is a top view showing a semiconductor wafer being transported by robotic means to a retaining ring storage station having one or more wafer retaining rings stacked therein.

Furthermore, as can be seen in FIG. 2 and subsequent top views, the lateral profiles of those portions of clip mechanisms 30 protruding from retaining ring 20, including tips 60, are very small, which also materially reduces interference with the various processing steps.

Referring now to FIG. 2 and subsequent drawings, the loading of wafer 10 into retaining ring 20 will be explained. In FIG. 2, a wafer 10 is shown being transported on a robotic means 70 in preparation for being loaded into a retaining ring 20.

Robotic means 70 includes a primary arm 72 and a secondary arm mechanism 76 pivotally connected to arm 72 by a shaft 74 onto which secondary arm mechanism 76 has been pressed to permit rotation of secondary arm mechanism 76 by rotation of shaft 74 by external means such as a belt (not shown) around shaft 74. Secondary arm mechanism 76 is generally forked shaped having a pair of tines or fingers 78 thereon on which wafer 10 is transported and which respectively carry pins 82 on the ends thereof. Secondary arm mechanism 76 may further comprise fluid power means 80 for laterally moving fingers 78 apart or together which, together with pins 82, may be used in the engagement of retaining ring 20 by robotic means 70, as will be described below.

Figure 5:
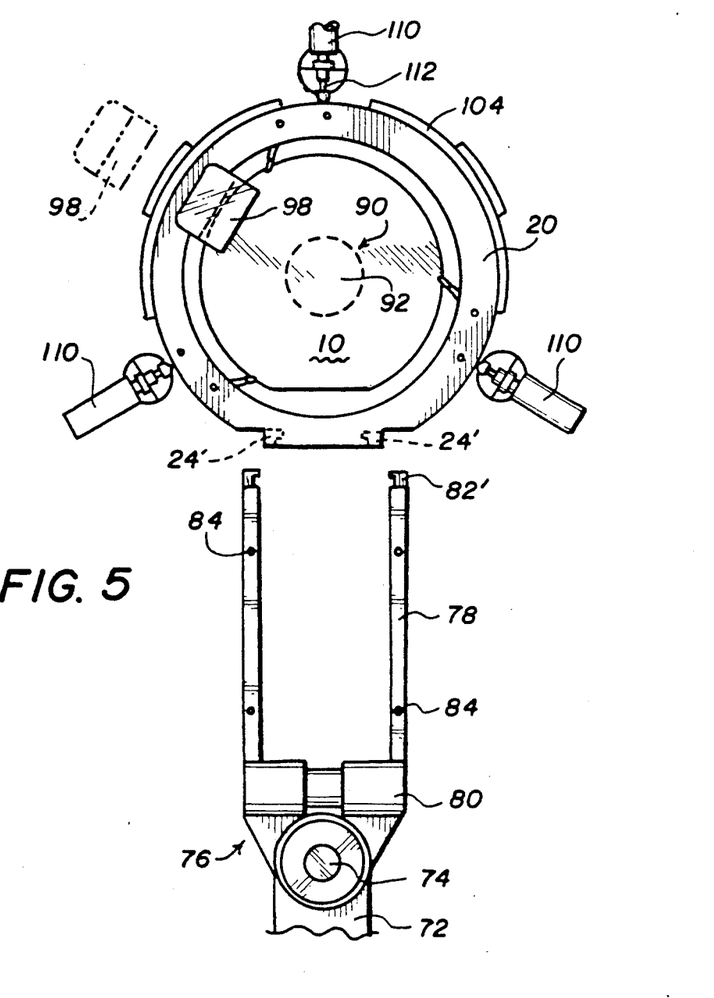
FIG. 5 is a top view showing the semiconductor wafer loaded on the orientation platform with the robotic means being withdrawn.

As seen more clearly in FIG. 5, robot means 70 may be provided with friction pads 84, which may be formed from soft plastic materials, which are mounted on the upper surfaces of fingers 78 and which may be used to engage the underside of wafer 10 to prevent slippage without, however, damaging the surface of wafer 10.

FIG. 2 also shows further construction details of one of the wafer engaging clip mechanisms 30 on retaining ring 20 which will be further described below in connection with FIGS. 8-10.

Figure 3:
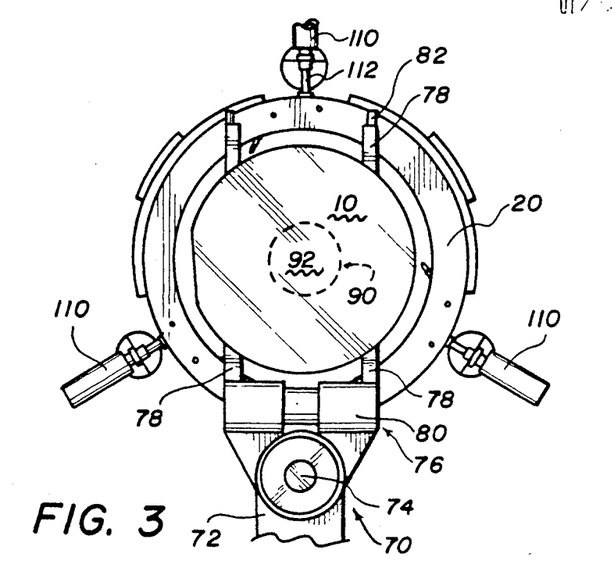
FIG. 3 is a top view showing a semiconductor wafer supported by robotic means positioned over the storage station containing one or more wafer retaining rings.
Figure 4:
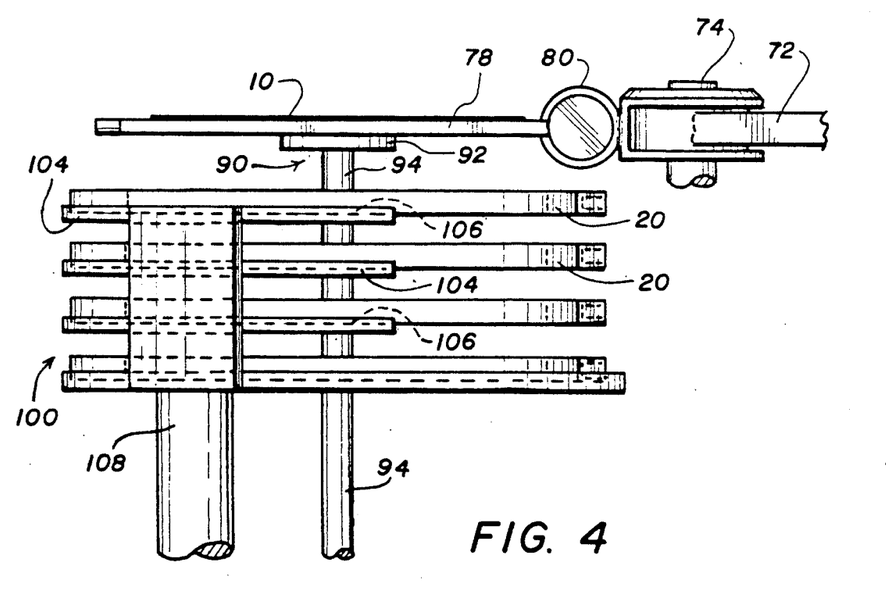
FIG. 4 is a side section view showing a semiconductor wafer supported by robotic means positioned over the storage station containing one or more wafer retaining rings as in FIG. 3 and also showing the position of a rotatable orientation or flat finding platform onto which the wafer will be unloaded by the robotic means to permit the wafer to be rotated to orient the flat edge of the wafer with respect to the retaining ring.

As shown in FIGS. 3 and 4, robot arm mechanism 70 moves wafer 10 into position over a rotatable orientation mechanism 90 comprising a platform or turntable 92 which may be raised and lowered, as well as rotated, by a shaft 94 beneath platform 92. When wafer 10 has been positioned by robot mechanism 70 over platform 92, shaft 94 is raised to remove wafer 10 from tines or fingers 78, as shown in FIGS. 5 and 6.

Still referring to FIG. 4, raisable and rotatable orientation mechanism 90 is mounted within a storage mechanism 100 which is capable of holding a number of retaining rings 20 in a stacked relationship. As shown in the side views of FIGS. 4, 6, and 7, and in the top views of FIGS. 2, 3, and 5, a series of retaining rings 20 may be stacked in retainer ring storage mechanism 100 which may comprise a circular frame 104 having a series of shoulders 106 thereon on which the respective retaining rings 20 may be stored. A support shaft 108 may be provided to raise and lower mechanism 100.

Orientation platform 92 is concentrically positioned within retaining ring storage mechanism 100 so that lowering of platform 92 will lower wafer 10 thereon into a position horizontally flush with the uppermost retaining ring in storage mechanism 100 to permit wafer 10 to be engaged by tips 60 on clips 30 on the uppermost retaining ring 20 within storage mechanism 100 as will be described below.

Figure 6:
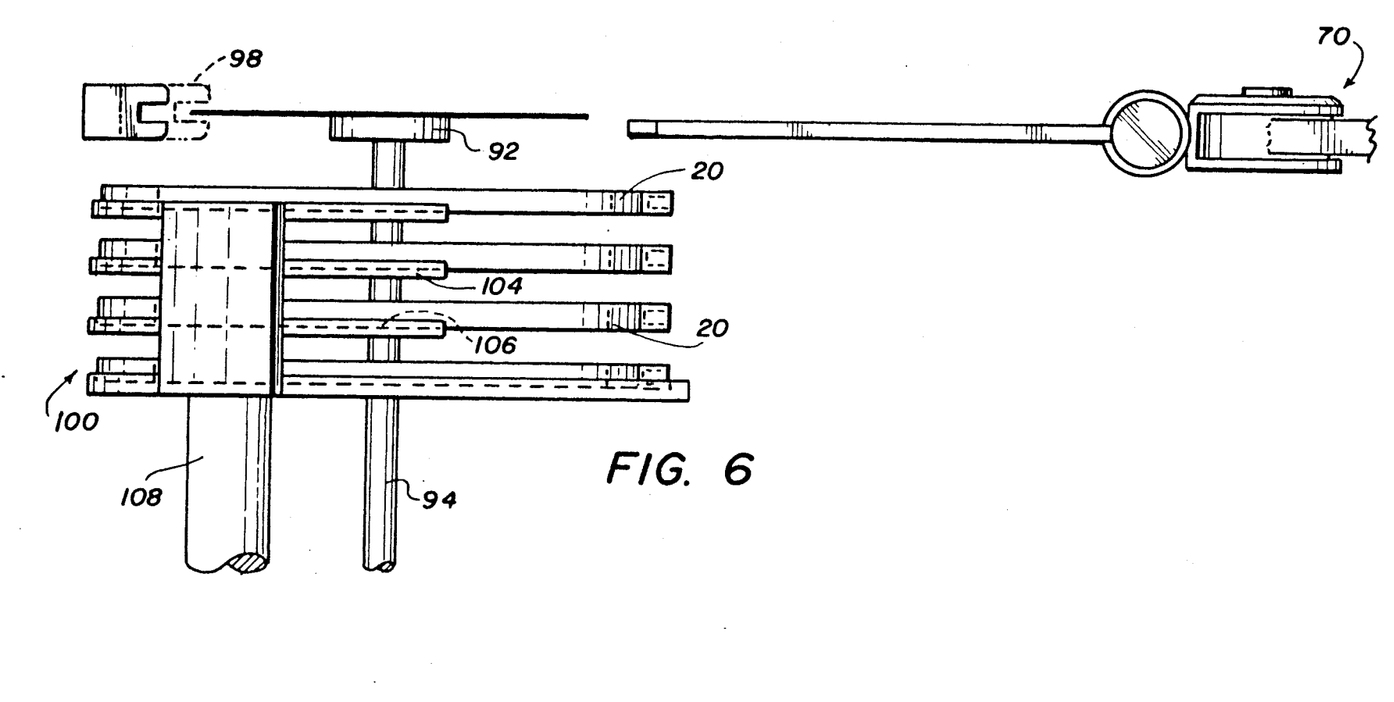
FIG. 6 is a side section view of the structure shown in FIG. 5.

Referring now to FIGS. 5 and 6, after loading of wafer 10 onto orientation platform mechanism 90 and withdrawal of robotic mechanism 70, wafer 10 is rotated on platform 92 to orient the flat side 12 of wafer 10, with respect to retaining ring 20, for purposes of future processing as is well known to those skilled in the art using suitable detection means such as the optical detector mechanism shown at 98 in FIG. 5, or other suitable means such as an LED or CCD array with emitter.

Figure 7:
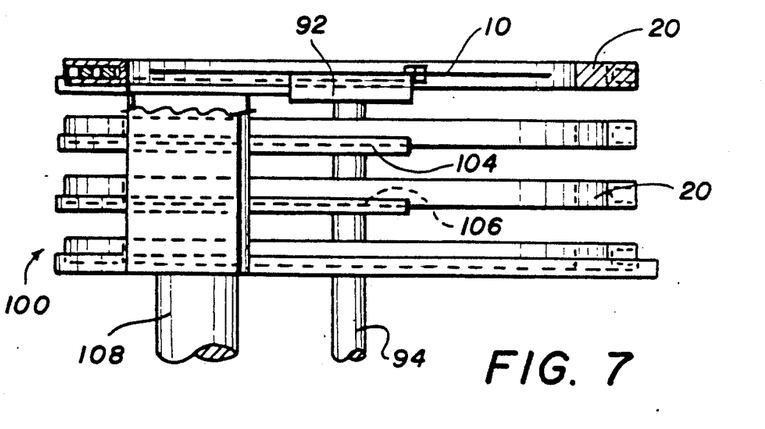
FIG. 7 is a side section view showing the orientation platform lowering the semiconductor wafer into engagement with the top retaining ring contained in the retaining ring storage station.

Either before or after the rotational orientation of wafer 10 is completed, shaft 94 lowers platform 92 and wafer 10 thereon into a position for engagement of wafer 10 by clip mechanisms 30 on retaining ring 20 as shown in FIG. 7.

As shown in top views of FIGS. 2, 3, and 5, a plurality of fluid power cylinders 110, which may be either pneumatic or hydraulic powered, are spaced around retaining ring storage mechanism 100 for engagement with clip mechanisms 30 via shafts 112, respectively coupled to each fluid power cylinder 110. Cylinders 110 are activated to laterally retract clip mechanisms 30, as will be described below, when a wafer 10 is lowered by platform mechanism 90 to the plane defined by the uppermost retaining ring 20 in retaining ring storage mechanism 100.

Figures 8, 9, 10, 11, 12:
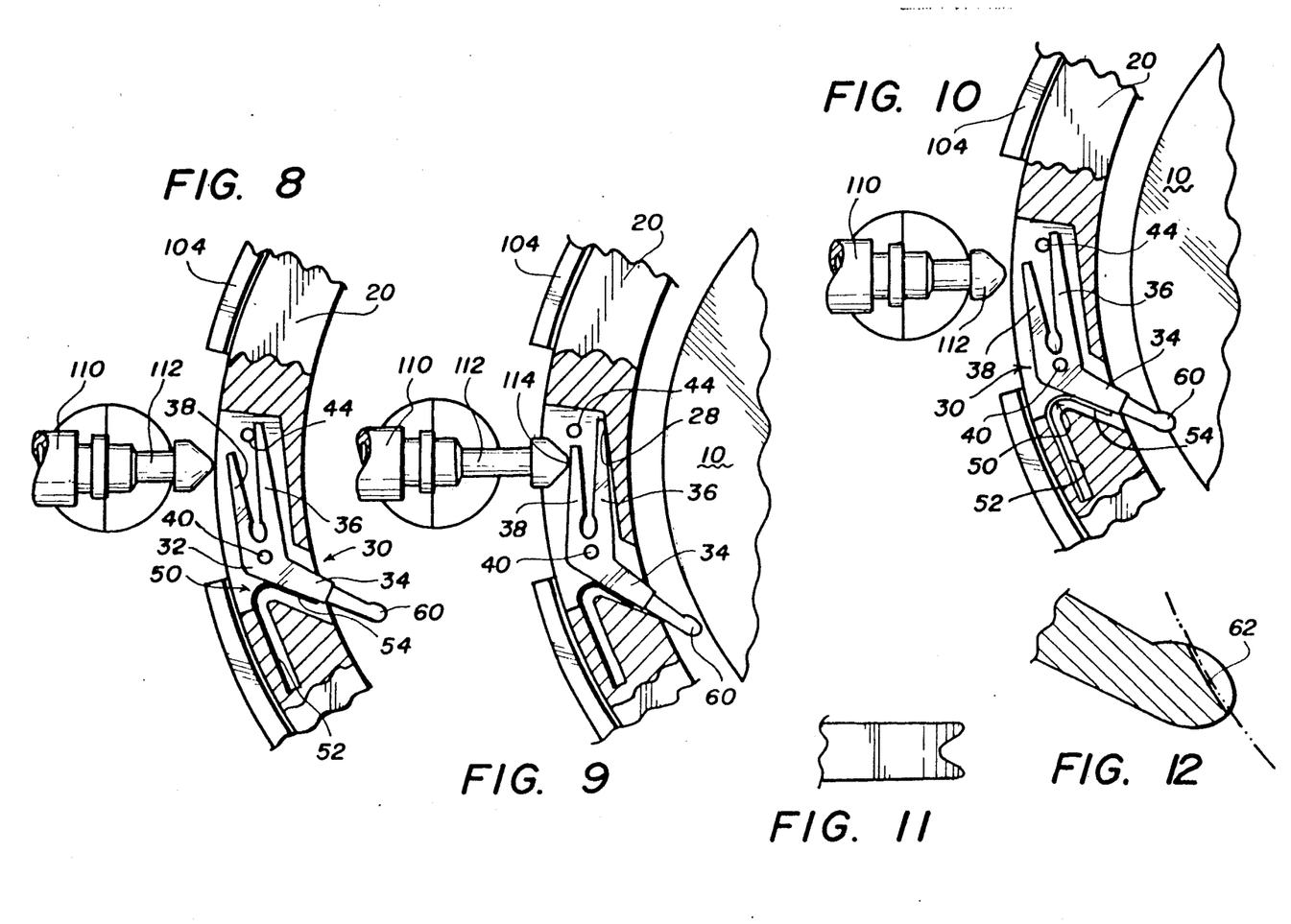
FIGS. 8-10 are fragmentary top views showing, sequentially, the engagement of the semiconductor wafer by metallic spring clips carried by the retaining ring.
FIG. 11 is a fragmentary side section view of end of the tip of the clip which engages the wafer edge.
FIG. 12 is a fragmentary cut-away top view of the end of the tip of the clip which engages the wafer edge.

Referring now to the sequential steps shown in FIGS. 8-10 for engagement of wafer 10 by clip mechanisms 30, it will be seen that clip mechanisms are carried in cutaway portions of retaining ring 20 with only a small portion of the clip mechanism protruding from retaining ring for engagement with wafer 10. This serves to reduce any interference by the materials comprising clip mechanism 30 with the subsequent processing of wafer 10.

As shown in FIG. 8, fluid power cylinder 110 is shown in an inactivated position with shaft 112 withdrawn from contact with clip mechanism 30.

Clip mechanism 30, in the embodiment shown in FIGS. 8-10, may comprise an aluminum or stainless steel crank member 32 pivotally mounted at pivot pin 40 to retaining ring 20. A spring 50, having a first portion 52 resting on the outer edge of retaining ring 20, has a second portion 54 which is yieldably urged against a first arm 34 of crank member 32 to maintain crank 32 normally in the position shown in FIG. 8. A second arm 36 on crank 32 is urged by spring 50 against a second pin 44 which acts as a stop to limit the rotational travel of crank 32.

Fitted into an opening in the end of arm 34 is tip 60 which may be constructed of a metal such as aluminum, which may or may not be anodized, or a ceramic material such as alumina or to minimize any interference with the processing wafer 10 which is contacted by tip 60. As best seen in FIGS. 11 and 12, ceramic tip 60 is provided, at its end, with a concavely radiused or curved groove 62, i.e., a groove which, in side section may be v-shaped, as seen in FIG. 11, and which, when viewed from the top, as seen in the cutaway top view of FIG. 12, preferably closely matches the radius of the wafer edge, i.e., the curvature of the wafer when viewed from the top. This curvature of groove 62 will distribute the force exerted against the wafer by clip mechanism 30 when tip 60 is brought into contact with the end edge of wafer 10.

Figures 13, 15, 16:
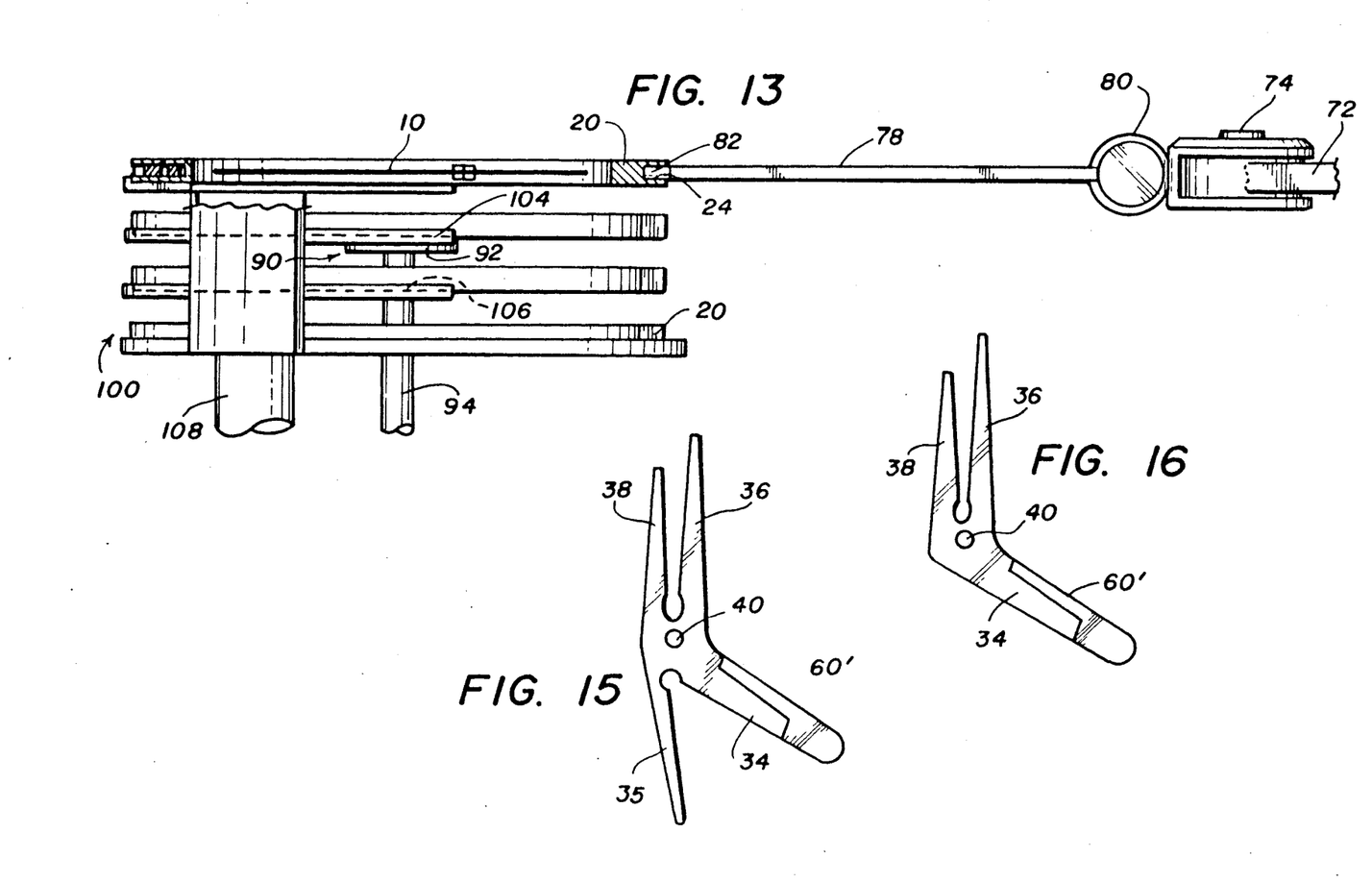
FIG. 13 is a side section view showing the top retaining ring in the retaining ring storage station having a semiconductor wafer loaded therein and the entire storage station being indexed upwardly to the plane of the robotic means and the robotic means being extended to engage the top retaining ring and remove it from the storage station.
FIG. 15 is a top view of an alternate embodiment of the wafer-engaging clip showing a ceramic end piece bonded to the metal clip.
FIG. 16 is a top view of another alternate embodiment of the wafer-engaging clip showing an additional spring arm integral with the clip to eliminate the need for a separate spring to urge the clip into yieldable engagement with the end edge of the wafer.

FIG. 15 illustrates an alternates embodiment of clip mechanism 30 in which a ceramic tip 60' is fitted to a cutaway portion of arm 34 and then suitably fastened to the side of arm 34 by bonding or the like.

In FIG. 16, the embodiment shown in FIG. 15 has been further modified. Spring 50 has been replaced by a yieldably arm 35 which is integral with crank 34 rather than a separate member.

Turning now to FIG. 9, when wafer 10 has been lowered by platform mechanism 90 to a vertical position for loading wafer 10 into retaining ring 20 (FIG. 7), fluid power cylinders 110 are activated to urge shafts 112 thereon into engagement at 114 with crank 32. The point of contact 114 of shaft 112 with crank 32 comprises a third arm 38 which is dimensioned in thickness to be thin enough to be slightly yieldable when shaft 112 bears against it for a purpose which will be explained below.

The movement of shaft 112 against arm 38 of crank 32 causes a clockwise rotation of crank 32 against the spring bias of spring 50 until arm 36 comes to a stop against retaining ring 20 at 28. This clockwise rotation of crank 32 causes arm 34 on each of the clip mechanisms mounted in retaining ring 20 to be withdrawn to a position which permits wafer 10 to be lowered to a horizontal plane which vertically bisects retaining ring 20 without interference from clip mechanisms 30.

Once wafer 10 reaches this position, fluid power cylinders 110 may be inactivated resulting in a withdrawal of shafts 112 from engagement with arms 38 on respective clip mechanisms 30. This permits spring 50 on each clip mechanism to urge crank 32 in a counterclockwise direction which moves arm 34 on crank 32 back toward the end edge of wafer 10 until tip 60 on arm 34 contacts wafer 10 as shown in FIG. 10. At this point wafer 10 is yieldably secured in retaining ring 20 by clip mechanisms 30, and more particularly by the spring bias of springs 50.

When fluid power cylinders 110 are inactivated, the spring bias of spring 50 could cause arm 34 on crank 32 into a snapping engagement against wafer 10 which might result in damage to the wafer. However, the yieldable engagement of shaft 112 with arm 38 muffles or dampens the counterclockwise movement of crank 32 since the compression of arm 38 must first be removed before crank 32 will move.

Once clip mechanisms 30 on retaining ring 20 have been released to engage the end edges of wafer 10, as shown in FIGS. 10 and 13, robotic means 70 may be moved into position to engage retaining ring 20 by insertion of pins 82 (or 82') on the ends of fingers or tines 78 of secondary arm mechanism 76 into sockets 24 or grooves 24' on retaining ring 20, as shown, respectively, in FIGS. 2, 5, 14, and 17. At the same time support shaft 108 lowers retaining ring storage mechanism 100 to permit removal of the retaining ring 20 engaged by robotic mechanism 70.

Figure 14:
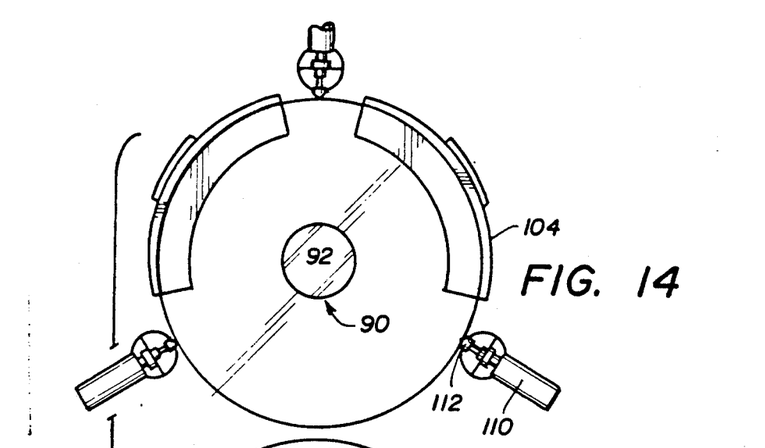
FIG. 14 is a top view showing the robotic means laterally moving the retaining ring containing the semiconductor wafer away from the retaining ring storage means in preparation for moving the retaining ring and semiconductor wafer therein to a processing station.
Figure 17:
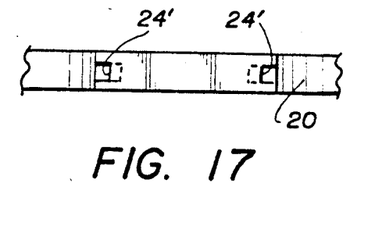
FIG. 17 is a side view of the retaining ring showing grooves formed in the side thereof which may be engaged by the robotic means to transport the retaining ring and wafer loaded therein from one process station or apparatus to another without direct contact with the wafer.

When the openings in retaining ring 20 comprise grooves 24', as shown in FIGS. 5, 14, and 17, robotic means 70 may be moved toward retaining ring 20 with fingers 78 in an extended position until contact is made with retaining ring 20 after which fingers 78 may be drawn toward one another by lateral movement means 80.

Alternatively, when the openings in retaining rings 20 comprise sockets 24, as shown in FIG. 2, fingers 78 are moved toward one another or apart, as the case may be, until pins 82 on fingers 78 are aligned with sockets 24 in retaining ring 20 after which robotic means 70 is laterally moved to insert pins 82 into socket openings 24.

To retain pins 82 or 82' in either sockets 24 or grooves 24' during subsequent movement of robotic means 70 to transport retaining ring 20 and wafer 10 mounted therein, lateral movement means 80 may then be energized to exert lateral pressure on the respective sidewalls of sockets 24 or grooves 24' by pins 82 or 82'.

Figure 18:
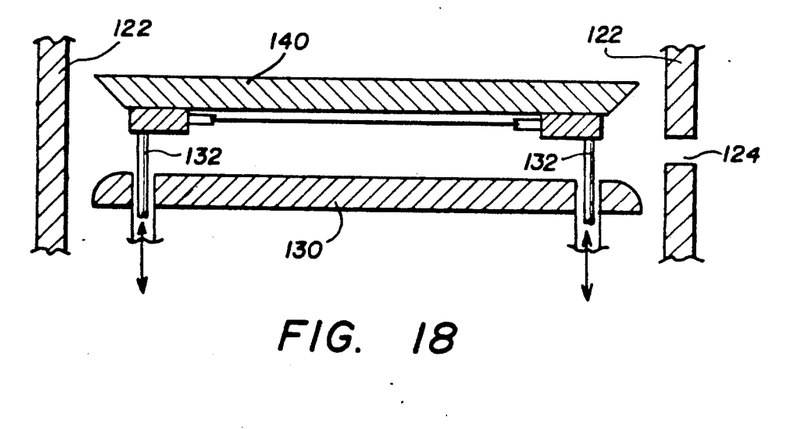
FIG. 18 is a fragmentary side section view of the wafer/retaining ring assembly of the invention being held in a processing station.

Robotic mechanism 70 may now transport the assembly comprising wafer 10 mounted in retaining ring 20 to a first process station generally indicated at 120 in FIG. 18 by the broken away portions of walls 122 and opening 124. Robotic mechanism 70 may then deposit the wafer/retaining ring assembly on a cathode 130 in first processing station 120 and then robotic mechanism 70 is withdrawn from the processing station.

Either the top surface, bottom surface, or both surfaces of wafer 10 may now be suitably processed to construct integrated circuit structures therein. For example, as shown in FIG. 18, the lift pins 132 in cathode 130 may be extended to clamp retaining ring 20 against anode 140 which is maintained at ground potential, thus effectively grounding wafer 10 while cathode 130 functions as the driven plane for processing of the backside of wafer 10. For this application, of course, it will be necessary that both ring 20 and tip 60 on clip mechanism 30 be constructed of metal or other electrically conductive materials to achieve the desired grounding of wafer 10.

When it is desired to remove the wafer/retaining ring assembly from the first processing station to move the assembly to a second station for further processing, lift pins 132 are withdrawn to lower wafer 10 back to the surface of cathode 130 and robotic mechanism 70 may then be used to reengage retaining ring 20 via sockets 24 therein and the wafer/retaining ring assembly is again transported to another processing station.

After all desired processing steps have been carried out, the wafer may be removed from the retaining ring by a reversal of the steps described above for insertion of the wafer into the retaining ring.

Thus, in accordance with the invention semiconductor wafer 10 may be transported to any number of processing stations where one or both sides of wafer 10 may be processed, i.e., etched, or have a layer of material deposited thereon or removed therefrom, etc. without any direct handling of the wafer and without interference from the retaining means used to engage the wafer, both in transport from one processing station to another as well as during actual processing in a particular processing station.

It should be further noted that the use of retaining ring 20 to engage wafer 10 need not be limited to operations such as depositions and dry etches normally carried out in a single station or multiple station vacuum apparatus. Rather it is envisioned that wafer 10 may also be retained within retaining ring 20 during other process steps as well such as, for example, application, patterning, and removal of photolithography materials (photoresists), wet etching, etc. In the latter case, of course, care must be taken in selection of the type of material from which retaining ring 20 will be constructed to ensure that the retaining ring is not attacked by the etchant.

Basically, the features which a retaining ring constructed in accordance with the invention should include are: provision on the retaining ring for engagement of the ring by remote means to permit the retaining ring and wafer mounted therein to be transported from one processing station to another without direct handling of the wafer; a ring with an inner diameter sufficiently large to permit processing of both sides of the wafer equally without interference from the ring; and provision of a low profile releasable wafer engagement mechanism on the ring to permit the end edges of the wafer to be grasped by the retaining ring, with little if any interference with the processing of the wafer.

Thus, while the invention has been described with regard to specific embodiments of construction of the retaining ring of the invention, it will be understood that modifications of the retaining ring itself, including the means for grasping the wafer as well as the means used for engaging the retaining ring for remote transport may be made without departing from the spirit of the invention.

Having thus described the invention, what is claimed is:

1. Apparatus for handling semiconductors wafers used for the production of integrated circuit structures which permits processing of both the top and bottom surfaces of the wafer which comprises:
   a) a retaining ring having engagement means thereon to permit said retaining ring to be engaged to transfer said wafer and said retaining ring from one processing station to another to perform one or more processing steps on one or more surfaces of said wafer;
   b) clip means carried by said retaining ring for yieldably engaging the end edges of said wafer leaving both the top and bottom surfaces of said wafer exposed for processing;
   c) tip means on said clip means having a groove therein to engage only the end edges of said wafer;

d) means for activating said clip means to yieldably engage the end edges of said wafer after insertion of said wafer into said retaining ring; and e) an inner diameter on said retaining ring sufficiently larger than the outer diameter of said wafer to permit equal processing of both sides of said wafer without interference by shadowing from said retaining ring.

2. The apparatus of claim 1 wherein means are further provided for radially orienting a flat portion on said end edges on said wafer with respect to said engagement means on said retaining ring prior to inserting said wafer into said retaining ring.

3. The apparatus of claim 1 wherein said groove on said tip means has a curvature therein substantially the same as the radius of said wafer to distribute the force exerted by said clip means against said wafer.

4. The apparatus of claim 1 wherein said tip means is constructed of a material selected from the class consisting of a metal and a ceramic.

5. The apparatus of claim 4 wherein said tip means is a ceramic material.

6. The apparatus of claim 4 wherein both said retaining ring and said clip means, including said tip means thereon comprise electrically conductive materials to permit grounding said wafer by contacting said retaining ring to ground it.

7. The apparatus of claim 1 wherein said means for activating said clip means comprise means for moving said clip means and said tip means thereon into and out of engagement with the end edges of said wafer in a direction parallel to the plane of said wafer.

8. The apparatus of claim 7 wherein said means for activating said clips means further comprise biasing means which urge said clip means and said tip means thereon toward said wafer in a direction parallel to the plane of said wafer to engage the end edges of said wafer.

9. The apparatus of claim 7 which further includes storage means for removably storing a plurality of said retaining rings in a vertical stack.

10. The apparatus of claim 9 wherein means are provided in said storage means for radially orienting said wafer prior to said engagement of said wafer by one of said retaining rings.

11. The apparatus of claim 10 wherein said means for radially orienting said wafer includes a rotatable platform concentrically mounted in said storage means to receive said wafer and rotate it prior to engagement by one of said retaining rings.

12. A method of handling semiconductors wafers used for the production of integrated circuit structures which permits moving said wafer from one processing station to another without direct handling of said wafer and which also permits equal processing of both the top and bottom surfaces of the wafer which comprises:

a) inserting said wafer into a retaining ring having an inner diameter sufficiently larger than the outer diameter of said wafer to permit processing of both sides of said wafer without shadowing by said retaining ring;

b) engaging the end edges of said wafer with yieldable means carried by said retaining ring including tip means having a groove therein to engage only the end edges of said wafer leaving both the top and bottom surfaces of said wafer equally exposed for processing; and c) contacting said retaining ring with remote means to transfer said wafer and said retaining ring from one processing station to another to perform a plurality of processing steps on one or more surfaces of said wafer.

13. The method of claim 12 wherein said step of engaging the end edges of said wafer further comprises moving said tip means into and out of engagement with the end edges of said wafer in a direction parallel to the plane of said wafer.

14. The process of claim 13 including the further step of releasing said wafer from said retaining ring upon completion of said processing steps.

15. The process of claim 13 including the further step of activating said yieldable means in said retaining ring to yieldably engage the end edges of said wafer after insertion of said wafer into said retaining ring.

16. The process of claim 13 including the further step of rotating said wafer to radially orient a flat portion on the end edge of said wafer with respect to one or more fixed points on said retaining ring prior to inserting said wafer into said retaining ring.

17. The process of claim 16 wherein said step of contacting said retaining ring to transfer said wafer and said retaining ring from one processing station to another further comprises engaging said one or more fixed points on said ring to which a flat side portion of said wafer is radially oriented.

18. Apparatus for handling semiconductors wafers used for the production of integrated circuit structures which permits processing of both the top and bottom surfaces of the wafer which comprises:

a) a retaining ring having engagement means thereon to permit said retaining ring to be engaged to transfer said wafer and said retaining ring from one processing station to another to perform one or more processing steps on one or more surfaces of said wafer;

b) means on said retaining ring for engaging the end edges of said wafer leaving both the top and bottom surfaces of said wafer exposed for processing;

c) an inner diameter on said retaining means sufficiently larger than the outer diameter of said wafer to permit equal processing of both sides of said wafer without interference by shadowing from said retaining ring;

(d) storage means for removably storing a plurality of said retaining means in a vertical stack;

(e) a rotatable platform concentrically mounted within said storage means to receive said wafer and rotate it to radially orient said wafer prior to insertion of said wafer into said retaining ring and engagement of said wafer by said retaining ring; and (f) means connected to said platform for lowering said wafer into a position for engagement with a retaining ring stored in said vertical stack in said storage means.

19. The apparatus of claim 18 wherein said engagement means on said retaining ring which permit said wafer and said retaining ring to be engaged for transferring said retaining ring and said wafer from one processing station to another further comprises engagement means positioned at a fixed point on said ring to which a flat side portion of said wafer is radially oriented.

20. The apparatus of claim 18 wherein said apparatus further comprises remote means for engaging said engagement means on said retaining ring to permit said retaining ring and said wafer therein to be moved without contacting said wafer.

21. The apparatus of claim 20 wherein said storage means is further provided with means to lower said storage means with respect to said wafer once said wafer has been loaded into said retaining ring in said stack and said engagement means on said retaining ring have been engaged by said remote means to transfer said wafer and said retaining ring from one processing station to another.

22. Apparatus for handling semiconductors wafers used for the production of integrated circuit structures which permits processing of both the top and bottom surfaces of the wafer which comprises:
   a) a retaining ring having engagement means located at a particular position thereon to permit said retaining ring to be engaged to transfer said wafer and said retaining ring from one processing station to another to perform one or more processing steps on one or more surfaces of said wafer;
   b) clip means carried by said retaining ring for yieldably engaging the end edges of said wafer leaving both the top and bottom surfaces of said wafer exposed for processing;
   c) tip means on said clip means having a groove therein to engage only the end edges of said wafer;
   d) means for activating said clip means to yieldably engage the end edges of said wafer after insertion of said wafer into said retaining ring; and
   e) an inner diameter on said retaining ring sufficiently larger than the outer diameter of said wafer to permit equal processing of both sides of said wafer without interference by shadowing from said retaining ring.

23. Apparatus for handling semiconductors wafers used for the production of integrated circuit structures which leaves both the top and bottom surfaces of the wafer completely exposed for processing which comprises:
   a) a retaining ring having engagement means thereon to permit said retaining ring to be engaged to transfer said wafer and said retaining ring from one processing station to another to perform one or more processing steps on one or more surfaces of said wafer;
   b) clip means carried by said retaining ring for yieldably engaging the end edges of said wafer leaving both the top and bottom surfaces of said wafer exposed for processing;
   c) tip means on said clip means having a groove therein to engage only the end edges of said wafer;
   d) means for activating said clip means to yieldably engage the end edges of said wafer after insertion of said wafer into said retaining ring; and
   e) an inner diameter on said retaining ring sufficiently larger than the outer diameter of said wafer to leave both surfaces of said wafer completely open for processing without interference by shadowing from said retaining ring.

24. Apparatus for handling semiconductors wafers used for the production of integrated circuit structures which permits processing of both the top and bottom surfaces of the wafer which comprises:
   a) a retaining ring having engagement means thereon to permit said retaining ring to be engaged to transfer said wafer and said retaining ring in and out of one processing station to perform one or more processing steps on one or more surfaces of said wafer;
   b) clip means carried by said retaining ring for yieldably engaging the end edges of said wafer leaving both the top and bottom surfaces of said wafer exposed for processing;
   c) tip means on said clip means having a groove therein to engage only the end edges of said wafer;
   d) means for activating said clip means to yieldably engage the end edges of said wafer after insertion of said wafer into said retaining ring; and
   e) an inner diameter on said retaining ring sufficiently larger than the outer diameter of said wafer to permit equal processing of both surfaces of said wafer without interference by shadowing from said retaining ring.

25. Apparatus for handling semiconductors wafers used for the production of integrated circuit structures which leaves both the top and bottom surfaces of the wafer completely exposed for processing which comprises:
   a) a retaining ring having engagement means thereon to permit said retaining ring to be engaged to transfer said wafer and said retaining ring in and out of one processing station to perform one or more processing steps on one or more surfaces of said wafer;
   b) clip means carried by said retaining ring for yieldably engaging the end edges of said wafer leaving both the top and bottom surfaces of said wafer exposed for processing;
   c) tip means on said clip means having a groove therein to engage only the end edges of said wafer;
   d) means for activating said clip means to yieldably engage the end edges of said wafer after insertion of said wafer into said retaining ring; and
   e) an inner diameter on said retaining ring sufficiently larger than the outer diameter of said wafer to leave both surfaces of said wafer completely open for processing without interference by shadowing from said retaining ring.

26. The apparatus of claim 2 including a rotatable platform to receive said wafer and rotate it prior to engagement by said retaining ring.

* * * * *